US006331731B1

(12) United States Patent
Kelly et al.

(10) Patent No.: US 6,331,731 B1
(45) Date of Patent: Dec. 18, 2001

(54) COLUMN FOR MODULE COMPONENT

(75) Inventors: Kimberley Anne Kelly, Poughkeepsie; Roy Yu, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 779 days.

(21) Appl. No.: 08/568,847

(22) Filed: Dec. 7, 1995

(51) Int. Cl.[7] ................................................. H01L 23/12
(52) U.S. Cl. ......................... 257/704; 257/712; 257/706
(58) Field of Search .................................. 257/704, 712, 257/729, 774, 778, 706, 713

(56) References Cited

U.S. PATENT DOCUMENTS

| 4,651,192 | 3/1987 | Matsushita et al. ................... 357/74 |
| 5,099,310 | 3/1992 | Osada et al. ........................... 357/81 |
| 5,138,439 | 8/1992 | Kobiki .................................... 357/80 |
| 5,324,987 | 6/1994 | Iacovangelo et al. ............... 257/701 |
| 5,506,755 | * 4/1996 | Miyagi et al. ....................... 257/712 |
| 5,543,661 | * 8/1996 | Sumida ................................ 257/707 |

FOREIGN PATENT DOCUMENTS

| 5-267512 | * 10/1993 | (JP) ..................................... 257/712 |

OTHER PUBLICATIONS

IBM TDB vol. 31 No. 4 Sep. 1988, "Thermal Enhancement of Thermal Cap", pp. 372–373.*

* cited by examiner

Primary Examiner—Roy Potter
(74) Attorney, Agent, or Firm—Ira D. Blecker

(57) ABSTRACT

A component of a module includes a column therethrough that conducts heat or equalizes the density of a surface of the component to enhance the uniformity of the etch of the surface. The module includes an integrated circuit chip that is connected therein by a controlled collapse chip contact/connection method. The component is a cap or insulator layer.

15 Claims, 4 Drawing Sheets

COLUMN FOR MODULE COMPONENT

TECHNICAL FIELD

This invention generally relates to modules that include an integrated circuit chip therein. More particularly, the invention relates to a column in a module component, the column being capable of transferring heat or equalizing the density of a component surface to enhance uniformity of the etching of the surface.

BACKGROUND OF THE INVENTION

FIG. 1 illustrates a prior art module 10 that includes an integrated circuit chip 12 in a cavity 14 formed by a package 16 and a cap 18. The module 10 is made by positioning solder (not shown) between the chip 12 and bond pads 20 of the package 16. Upon exposure to elevated temperature, the solder collapses to form electrical connections 22 between the chip 12 and the package 16 and to bond the chip 12 and package 16 together. This method of connecting the chip 12 and the package 16 is referred to as the controlled collapse chip contact/connection (C4) method. A layer 24 of adhesive paste between the chip 12 and the cap 18 attaches the cap 18 to the chip 12.

Heat generated when electricity passes through the chip 12 must be removed from the chip 12 to prevent its damage. The heat is generated on the side of the chip 12 where the connections 22 are made. Typically, heat is removed from a backside 26 of the chip 12 which requires the heat to be conducted through the chip 12, the adhesive layer 24 and the cap 18 before it is dissipated away from the module 10 with the help of fin array 28 on the cap 18. The fin array 28 is required because the cap 18 is not a large enough heat sink, i.e., the cap 18 cannot absorb large amounts of heat and release it quickly, to lower the temperature of the chip 12. The adhesive layer 24 acts as a thermal insulator which slows the removal of heat from the chip 12. Heat removal is also slowed because the heat must be transferred through the chip 12 and the cap 18.

Heat is not removed through the package 16 because multiple thin layers 30 of insulator greatly inhibit the flow of heat therethrough. A substrate 31 of the package 16 is a much better heat sink than the cap 18 but the thin insulator layers 30 prevent its use as a heat sink.

The thin insulator layers 30 electrically insulate metal electric vias 32 which have a cross-sectional area effective to permit an electrical connection between the chip 12 and input/output pins 34 but ineffective to contribute to heat transfer through the insulator layers 30. The cross-sectional dimension of the electrical vias 32 is less the line width specified by patterning ground rules.

Each layer 30 is conventionally formed by laying down a seed metal layer, laying down a layer of resist material, selectively removing the resist material to form holes and lines in locations where metal will be plated (for the vias 32 that provide electrical paths between layers and lines 36 that provide electrical paths on a layer, respectively), plating up a metal layer in the locations, removing the resist material, etching to remove the seed layer and depositing insulator (unless indicated otherwise, these layers are not shown). The total surface area of the vias 32 on one of the insulator layers 30 is extremely small and is typically less than about 0.1 percent based on the total surface area of the insulator layer 30. Further, not all vias, e.g., via 32A, extend through all of the insulator layers 30. The extremely small surface area and the vias not extending through all of the insulator layers 30 contributes to the poor heat transfer through the insulator layers 30 and the layers 30 being thermal insulators. Within the insulator layers 30 are regions 38 with no vias or lines which causes the regions 38 to etch at a rate faster than the regions adjacent to the vias. The unequal etch rate causes over etching in the regions 38; with the vias 32 in adjacent areas not being uniform but rather varying in cross-section and height. The unequal etch rate also results in the insulator layers 30 not being planar on a microscopic scale (which cannot be illustrated in FIG. 1). When the insulator layers 30 are not planar, the vias 32 in adjacent insulator layers 30 may not align which results in the package 16 being defective. The problem of over etching and the insulator layers not being planar also occur in conventional lift off and subtractive metallization processes.

The lines 36 are only formed where they are needed to provide electrical connections and do not extend into regions 38A where they are not needed for electrical connections.

The electrical vias 32 include signal vias 32B that permit the chip 12 to communicate with other chips (not shown). The signal vias 32B often exposed to each other which permits "cross-talk" therebetween that interferes with the communications. The vias 32 do not shield the signal vias 32A to inhibit cross-talk.

FIG. 2 illustrates an alternative module 10A wherein chip 12A is electrically connected to a package 16A using wires 50 that extend from the chip 12A to wire bond pads 52 on the package 16A; this technique is known as wire bonding. There are no thin insulator layers between the chip 12A and a substrate 31A of the package 16A. Therefore, heat can be transferred from the chip 12A through the substrate 31A to cool the chip 12A.

A component of a module that exhibits improved heat transfer capabilities or enhances the uniformity of the etching of a surface thereof and which does not exhibit the above shortcomings is highly desirable.

SUMMARY OF THE INVENTION

The invention provides a component for a module that is capable of receiving a chip therein that is connected by a controlled collapse chip contact/connection method. The component includes at least one column therethrough that is capable of transferring heat through the component or equalizing the density of a component surface to enhance uniformity of etching of the surface. The component is a thin insulator layer of a package or a cap.

Numerous other advantages and features of the present invention will become readily apparent from the following detailed description of the preferred embodiments and the appended claims.

DETAILED DESCRIPTION OF THE PREFERRED EMBODIMENTS

Figure 3:
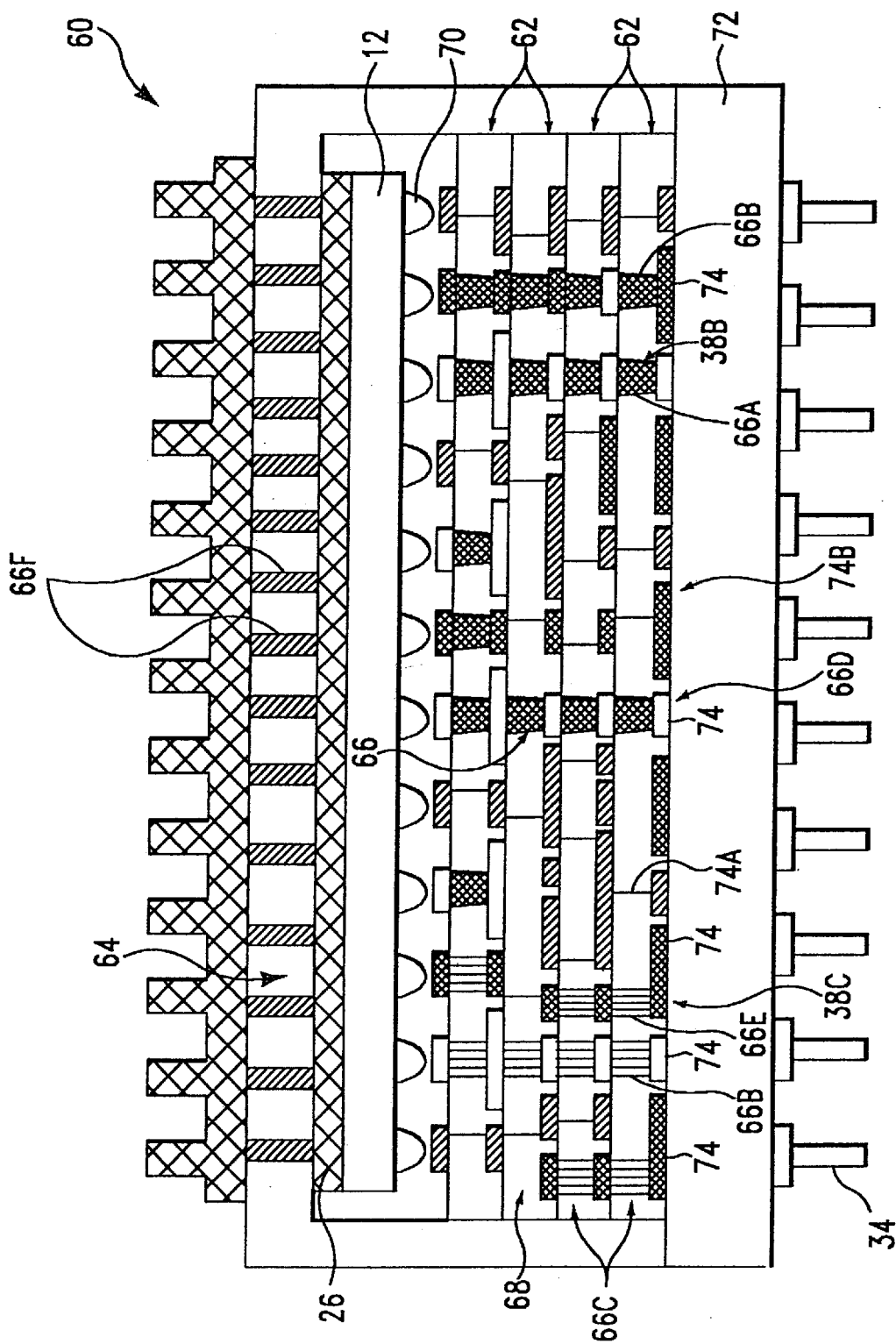
FIG. 3 illustrates a module having components of the present invention that include columns therein.

FIG. 3 illustrates a module 60 having as components multiple thin layers 62 of insulator and a cap 64, both of which contain columns 66 therethrough. The module 60 also includes a chip 12 therein which is electrically connected to a package 68 by a controlled collapse chip contact/ connection (C4) method. The package 68 includes the insulator layers 62. In an embodiment that is not illustrated, only one of the insulator layers 62 and the cap 64 has columns 66. The columns 66 permit heat generated by the chip 12 to be transferred through the insulator layers 62 and the cap 64.

Figure 1:
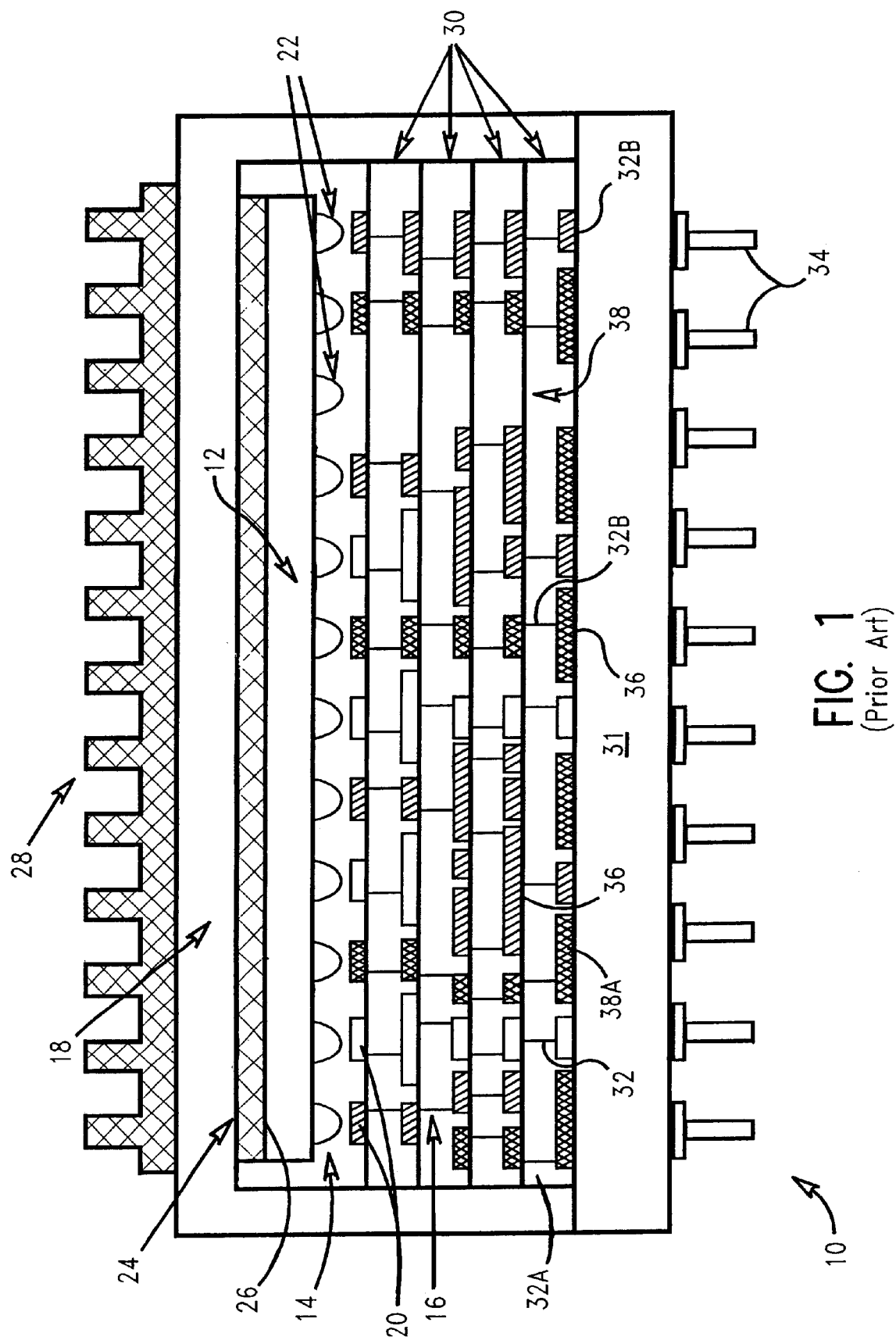
FIG. 1 illustrates a prior art module wherein a chip is connected to a package using a controlled collapse chip contact/connection method.
Figure 2:
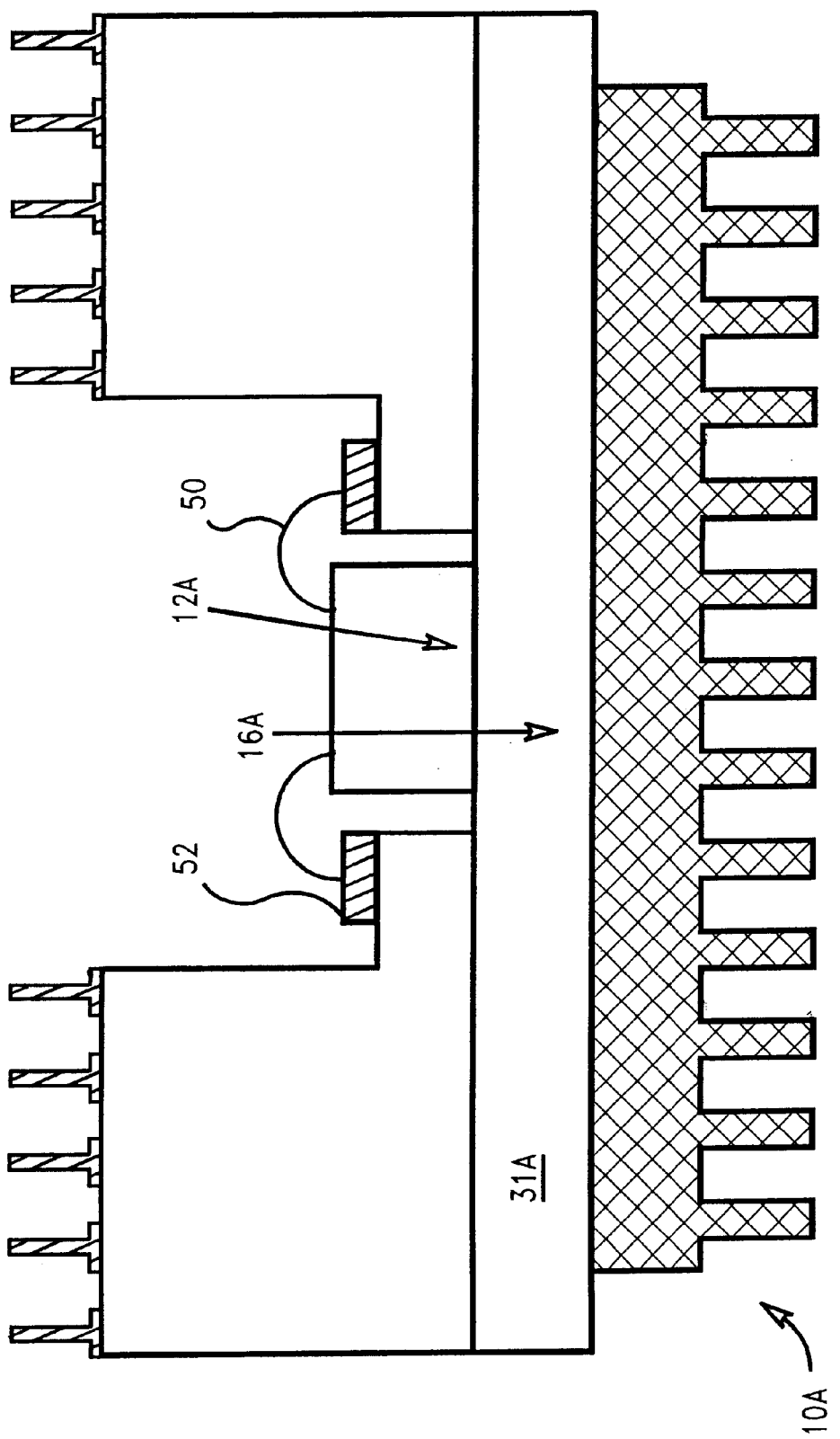
FIG. 2 illustrates a prior art module wherein a chip is connected to a package using a wire bonding method.

In the insulator layers 62, the columns 66 through each of the insulator layer 62 are preferably aligned with columns 66 of adjacent insulator layers 62 to permit transfer heat through multiple insulator layers 62. The columns 66A are through regions 38B in the insulator layers 62 that had no vias in the prior art insulator layers (FIG. 1). The column 66A is also illustrated as being adjacent a region 70 of the chip 12 that will not be used in the electric circuitry of the module 60. The column 66A can also be connected to an input/output pin 34 to further enhance the heat transfer capabilities of the column 66A. Columns 66B are vias that have been enlarged to provide heat transfer capabilities that are not present when vias are only used to conduct electricity.

The columns 66 preferably extend through all of the insulator layers 62. Columns 66C that do not extend through all of the insulator layers 62 still contribute to heat transfer. The columns 66 can be an elongate column 66E that extend into region 38C where they are not needed for electrical connections (compare, FIG. 1, region 38A). The elongate columns 66E contributes to the transfer of heat away from the chip 12 and acts like a heat sink that is spaced from the chip 12. The elongate columns 66E also contributes to equalization of the surface density which is discussed in more detail below in connection with the FIG. 4.

The columns 66 through the insulator layers 62 permit heat to be transferred from the chip 12 to a substrate 72 of the package 68 which acts as a heat sink. Since the substrate 72 has a mass that is about 100 times greater than the mass of the chip 12, it is presently theorized that the columns 66 will permit the chip 12 to be maintained at about the same temperature as the substrate 72.

The insulator layers 62 also have signal vias 74A and 74B therethrough. Columns 66D are positioned between adjacent signal vias 74A and 74B to shield them from each other to inhibit "cross-talk" therebetween.

Columns 66F through the cap 64 enhance the transfer of heat from a backside 26 of the chip 12 by providing better thermal conduction therethrough.

Figure 4:
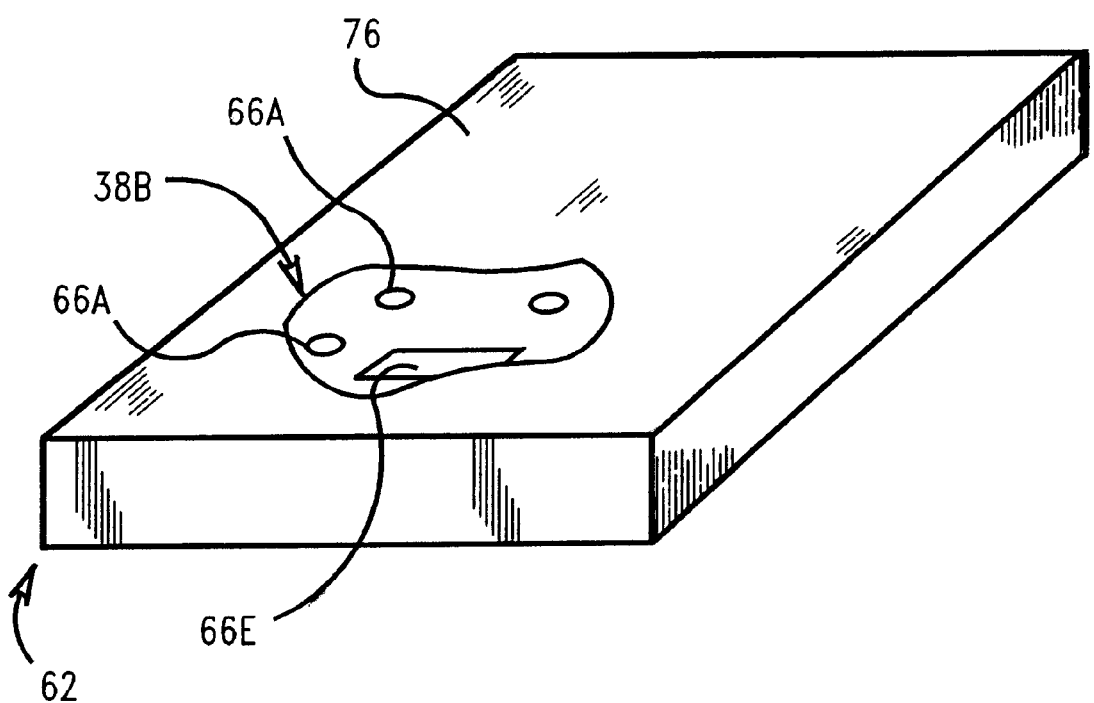
FIG. 4 is a sectional, planar view of an insulator layer having columns.

Referring to FIG. 4, the columns 66 can also equalize the density of a surface 76 of the insulator layer 62 to enhance uniformity of etching thereof. The region 38B has no vias or lines therein. The columns 66A and elongate column 66E are formed in the region 38B in an amount effective to equalize the density of the surface 76 to enhance uniformity of the etching of the surface 76. Equalization of the surface 76 contributes to each insulator layer 62 being planar which improves the quality of the package 68. When used only to equalize the density, the columns can be positioned in, and extend through, only the insulator layer that needs equalization and the columns need not align with columns in adjacent insulator layers.

The term "equalize", when used in its various grammatical forms in connection with density, means that the columns increase the density in a first region of the surface that had a relatively low percentage of surface area that contained metal as compared to a second region so that both regions etch at about the same rate.

When used for heat transfer, the columns preferably have a cross-sectional area greater than that required to only carry electricity and the total surface area of the columns on a surface is preferably greater than about 2% based on the surface area adjacent of the component. Representative heat conductive materials include metals such as those conventionally used in packages to make vias, e.g., copper, aluminum and the like. When used to equalize surface density, the size and positioning of the columns are effective to equalize the surface density and the columns are made of the same material used to make vias and lines that are on the surface.

The columns are made in the insulator layers by the conventional techniques used to make conventional vias and lines. The columns are made in the cap by creating a hole therethrough and then filling the hole with the heat conductive material.

A method of improving a component of a module includes the steps of providing the component, providing at least one column through the component and transferring heat through the column or equalizing the density of a surface of the component to enhance uniformity of etching of the surface.

It presently is theorized that the columns improve removal of heat from the chip to lessen the possibility that the chip will overheat and fail. Improved heat removal is theorized to make cooling easier since the heat will be conducted more efficiently away from the chip. The columns are also theorized to equalize the surface density of a surface of an insulator layer to permit the surface to be etched more uniformly as compared to an insulator layer that does not have equalized surface density. The uniform etching is theorized to result in insulator layers that are planar which permits vias to be aligned easier. The columns also strengthen the component, especially the insulator layers, making it more durable.

The present invention is particularly well suited for modules that have chips connected thereto by the C4 method.

This invention has been described in terms of specific embodiments set forth in detail. It should be understood, however, that these embodiments are presented by way of illustration only, and that the invention is not necessarily limited thereto. Modifications and variations within the spirit and scope of the claims that follow will be readily apparent from this disclosure, as those skilled in the art will appreciate.

We claim:

1. In a module that has a case with electrical contacts thereon and contains an integrated circuit chip and a circuit board therein which circuit board and chip have electrical connections on facing surfaces thereof formed by a controlled collapse chip contact connection method and which board has electrically conducting vias therein for the conduction of electricity to and from said connections to the electrical contacts, the improvement comprising:

columnar means formed of additional conductive vias, in said circuit board, configured for the transfer of heat in the circuit chip through the electrical connections on the facing surfaces of the circuit board and chip through the circuit board towards the case of the module; and
   contact means on the interior of the case to transfer heat from the columnar means to the case.

2. The module of claim 1 wherein said additional vias of said columnar means includes via means that connect at least one of said electrical connections directly to an interior surface of said case to transfer heat from said chip to said case.

3. The module of claim 2 wherein said circuit board is a multilayer board and said columnar means includes vias between one or more layers of the multilayer board that do not form a direct connection between any of said connections and any interior surface of said case.

4. The module of claim 3 wherein said case includes a cap a portion of which faces the backside of the chip which cap has paths therein for the conduction of heat from the backside of the chip to an exterior surface of the cap.

5. The module of claim 4 including a heat sink on said exterior surface of the cap in thermal connection with said paths.

6. The module of claim 5 wherein said case includes a base with an exterior surface from which electrical contacts face away from the heat sink.

7. The module of claim 6 wherein said interior surface of said case is an interior surface of the base.

8. The module of claim 3 wherein certain of said electrical connections connected to said via means perform no electrical function.

9. The module of claim 3 wherein said columnar means includes such means between adjacent electrical signal carrying vias for reducing cross talk between the electrical signal carrying vias.

10. The module of claim 3 wherein the total surface area of vias including the additional conductive vias of the columnar means is at least 2% of the total surface area of the component board.

11. In a module that has a case with electrical contacts thereon and contains an integrated circuit chip and a component board therein which component board and chip have electrical connections on facing front side surfaces thereof formed by a controlled collapse contact connection method that bonds the chip to the board and which board has electrically conductive vias therein for the conduction of electricity from said connections to the metal contacts, the improvement comprising additional electrically conductive vias configured into columnar means added to the component board at positions selected to equalize the density of conductive vias in a surface of the component board to enhance uniformity of an etch of that surface.

12. The module of claim 11 wherein said component board is a multilayer board.

13. The module of claim 12 wherein surface to be etched is an interior surface.

14. The module of claim 13 wherein said surface to be etched is an exterior surface.

15. In a module that has a case with electrical contacts thereon and contains an integrated circuit chip and a circuit board therein which circuit board and chip have electrical connections on facing surfaces thereof formed by a controlled collapse chip contact connection method and which circuit board has electrically conducting vias therein for the conduction of electricity to and from said electrical connections to the electrical contacts, the improvement comprising:

first columnar means formed of additional conductive vias, in said circuit board, configured for the transfer of heat only in the circuit chip through the electrical connections on the facing surfaces of the circuit board and chip through the circuit board towards the case of the module, said first columnar means connected to the electrical connections performing no electrical function;

second columnar means formed of additional conductive vias, in said circuit board, configured for the conduction of electricity and the transfer of heat in the circuit chip through the electrical connections on the facing surfaces of the circuit board and chip through the circuit board towards the case of the module, said second columnar means connected to the electrical connections performing both an electrical function and a thermal function; and contact means on the interior of the case to transfer heat from the columnar means to the case.

* * * * *